United States Patent [19]

Fox

[11] 4,136,393
[45] Jan. 23, 1979

[54] METHOD OF POWER DEMAND CONTROL WITH TIME DEPENDENT TARGET

[75] Inventor: Richard Q. Fox, Orlando, Fla.

[73] Assignee: Westinghouse Electric Corp., Pittsburgh, Pa.

[21] Appl. No.: 816,560

[22] Filed: Jul. 18, 1977

[51] Int. Cl.² ............................................. H02J 3/00
[52] U.S. Cl. ...................................... 364/492; 307/41
[58] Field of Search ................. 364/492, 493; 307/35, 307/39, 41, 52, 62; 324/103

[56] References Cited

U.S. PATENT DOCUMENTS

| | | | |
|---|---|---|---|
| 3,296,452 | 1/1967 | Williams | 235/151.21 |
| 3,522,421 | 8/1970 | Miller | 235/151.21 |
| 3,652,838 | 3/1972 | Dillon et al. | 235/151.21 X |
| 3,659,114 | 4/1972 | Polenz et al. | 235/151.21 X |
| 3,697,768 | 10/1972 | Johnston | 235/151.21 X |
| 3,862,430 | 1/1975 | Lenhart et al. | 307/62 X |
| 3,872,286 | 3/1975 | Putman | 235/151.21 |
| 3,987,308 | 10/1976 | Burch | 307/52 X |
| 4,023,043 | 5/1977 | Stevenson | 235/151.21 X |
| 4,034,233 | 7/1977 | Leyde | 235/151.21 X |

OTHER PUBLICATIONS

Power Demand Control–Inland's No. 1 Electric Furnace Shop; R. A. Balka & F. E. Demmon; Iron and Steel Engineer, Jun. 1975, pp. 32–38.

*Primary Examiner*—Edward J. Wise
*Attorney, Agent, or Firm*—C. M. Lorin

[57] ABSTRACT

The invention relates to power demand control of a number of loads in a plant facility in order to keep the power within a demand limit at the end of a demand period. During the billing period the invention provides for a demand limit floating up and/or down over the demand periods, and means is provided to dampen control action whenever the demand limit would tend to oscillate up and down over the successive demand periods.

2 Claims, 9 Drawing Figures

METHOD OF POWER DEMAND CONTROL WITH TIME DEPENDENT TARGET

CROSS-REFERENCE TO RELATED APPLICATIONS

The present invention is related to the following patent application which is assigned to the same assignee as the present application:

Ser. No. 791,827, filed Apr. 28, 1977 by R. Q. Fox, D. Sigut and J. H. McWhirter (W.E. 46,559).

BACKGROUND OF THE INVENTION

It is known to control sheddable loads during a demand period in accordance with a priority table in order to increase or decrease the power drawn from the power system by the industrial equipment of a plant and stay within limits above, or below, a projected power demand limit to be reached at the end of the period. See for instance U.S. Pat. No. 3,522,421 of W. H. Miller and No. 3,872,286 of R. E. S. Putman.

It is known from the aforementioned Putman patent to control loads during the billing period so as to maintain the power demand at the end of the period close to a limit, or target, assigned by the user at the beginning of the period. In the process, loads are shed, or switched on, in accordance with a table of priorities while constraints imposed on certain loads, which are exercised before any control decision, affect the actual consumption of energy as well as the availability for control during the period. The target having been assigned by the operator, the power demand control system automatically and constantly, during the demand period, determines an error over the target from an instantaneous computation based on the wattage at the moment. A residual error is also established on the basis of a selected load to be shed, or switched on, depending on the sign of such error. The residual error leads to either actual switching or a decision to pursue the search for a load among the available loads in the order of priorities. Control during the period is by trial and error loading by successive approximations to an actual demand at the end of the period which is sufficiently close to the intended power demand limit imposed by the operator.

It is known from Iron and Steel Engineer of June 1975, pages 32-38, entitled "Power Demand Control — Inland's No. 1 Electric Furnace Shop" by Ronald A. Balka and Floyd E. Demmon to calculate the rate of power consumption and to project on such basis the power usage to the end of the demand period and in so doing to take into account the rates computed for several prior demand pulses as well as the total demand pulses accumulated, thereby to keep the demand as close as possible to the target. A final demand which is too high would be costly and a final demand which is too low would be at the expense of the production capability of the plant.

It is also known from the Balka and Demmon article to change the load priorities scheduled by the computer program from demand period to demand period so that actual consumption follows more exactly the maximum power contract while satisfying the plant consumption requirements. This method amounts to imposing maximum power contract as a target to the system. The method, however, fails to seek as a target for the demand power demand at the end of the period a demand which is the closest to actual needs.

In practice, the loads in the plant are operated in accordance with production needs. This is the case for the ovens and furnaces, for instance. Some loads, though, merely assist in the production activity. These are for instance the fans and air conditioning units which operate within set constraints. All the loads of the plant, with or without any interruption, tend during the production activity to be ON and increase the demand. Therefore, the target assigned by the operator generally represents an upper limit to the power demand, not to be exceeded, and therefore requiring loads to be switched OFF, or interrupted with interruptions to be repeated, or lengthened in order to stay within such upper demand limit. If the demand limit has been placed too low in order to follow rigidly the requirement of cost reduction with the bills to the utility company, the consequence may be a curtailment of the overall activity in the plant by reducing the allocations of energy to the services supporting the production activity, and to the production units as well. Therefore, it is desirable to place the demand limit at an optimum level compatible with production requirements.

If the target must not be set too low since this would curb the production in the plant, it must not be set too high either since it would no longer effectively prevent an excessive demand. Therefore, it is desirable to establish the target for any billing period at an optimum level between too high and too low thereby to follow with good approximation the particular needs of the plant for the particular period.

However, the operator assigning a target to the power demand control system can only guess at the beginning of the billing period what the needs of the plants will be. He does not have enough information to optimize the balance between plant production requirements and power company demand billing.

It is observed here that the power demand limit imposed to the system at the beginning of the billing period is "ex ante," thus does not represent necessarily the best target for the on-coming billing period. It is also observed that a given target does not univocally determine how the actual consumption pattern will be in the plant since the latter depends upon the production priorities. These priorities are translated for control during the demand period by the priority table stored in the priority selector. Moreover, the calculations which are determining the error and are the basis for decision during the demand period depend upon the instantaneous combination of active loads and inactive loads, e.g., available and constrained loads. Correlatively, a change of targets may affect entirely the priority selection, and therefore the availability of loads under the system during the period. In the final analysis it is possible to allow a higher limit to the system in order to avoid unnecessary interruptions of production loads, while still deriving benefits from the power demand control system since the latter when in operation will assign temporary priorities, rotate the loads as scheduled and exercise the various constraints. However, an excessively high target will result in an excessively high bill from the power company for the actual demand.

It is in this context that an optimum target must be sought during each billing period so that savings can be obtained by limiting the power demand while at the same time allowing maximum consumption under a strict allocation as planned for the production in the plant.

The control system according to the present invention automatically adjusts power consumption in the plant during any particular billing period so as to hold the power demand through such billing period to an optimum demand limit.

The optimum target according to the present invention can best be explained in the context of the specification and drawings of U.S. Pat. No. 3,872,286 of Richard E. J. Putman issued on Mar. 18, 1975 and entitled "Control System And Method For Limiting Power Demand Of An Industrial Plant." Accordingly, the specification and drawings of U.S. Pat. No. 3,872,286 are hereby incorporated by reference for the purpose of providing a full description of the present invention.

As explained in the Putman patent, a production facility includes a plurality of loads which have received a special status in the order of production and a priority table has been established to allow them to be switched OFF or ON under power demand control. At a given moment, during the demand period, when decisions are to be made by the system, a load may be sheddable, e.g., have become available on a priority basis, or be no longer inhibited, e.g. an OFF time has lapsed to make it permissive. A load may be critical, e.g. under external requirements it may have become ON or OFF to follow local conditions overriding control by the system. Some loads never come under control of the system because they are "non-controllable" as the case is, for instance, for most lights, and more generally for the base load adding power constantly during the billing period. While at any instant during control operation the system receives a signal indicating the power in KW demanded from the utility company, this information represents a slope on the energy curve, and therefore it indicates power demand toward which the system is shooting at the end of the period. Control is effected by correcting the slope during the period so that the final demand will not exceed, or remain below, a target assigned to the plant power consumption at the end of the demand period. When attempting to control the demand to correct the slope by switching ON loads, there is a possibility that the slope increases to the point where it exceeds what is needed to stay on target.

In normal operation, if the target has been set right, the control system will cause loads to be switched ON, or OFF, so that under the priority selection tables the overall combination of loads in the plant is fully used as planned without overshooting or undershooting of the target.

If the target has been set too low, control will force many loads to be shut OFF, thus forcing the system down at the expense of production and against the plant planned requirements. If the target has been set too high, more loads will be switched ON and the consumption of power will be excessive; in fact, demand limiting will no longer be exercised.

The present invention is founded on a unique and new concept of a controlled optimization of the restrictions imposed by the demand limit during successive billing periods.

In the aforementioned Putman patent can be found the notion of using a pseudo-target for control during the billing period, which pseudo-target is abandoned and replaced by the real target before the end of the period is reached. This is the concept of a biased target which, as shown by Putman, is preferably under progressively reduced bias toward the end of the period. Such "moving" target, however, is used by Putman to allow heavier loads to be selected at the beginning of the period while lighter loads can be selected in the later part when the controlling margin is reduced.

In the Putman patent, also, is disclosed the assignment of a lower target in order to increase the rigidity of the system for better control, such lower target being automatically replaced by the assigned target later in the demand period when less rigidity has become necessary. This concept, however, does not suggest raising the target from one demand period to the next in order to reduce power demand while at the same time following the actual needs of the plant.

In accordance with the teaching of the Putman patent, whenever the demand is excessive, the lowest priority loads are turned OFF, while if the demand is insufficient to reach the target, the highest priority loads are turned ON. If the target is brought higher for the next demand period, assuming a Putman mode of control, more loads will be switched ON, or as a result of a lesser occurrence of excessive consumption anticipated, more loads of the lowest priority loads will remain ON. Thus by varying the target the system reaches a balance between production and charges for excessive demand.

However, whenever the production activity decreases substantially, the optimum target becomes too high. Although some rigidity in the control would be needed in order to save on the company bills, the control system no longer exerts control. It is proposed according to the present invention to lower the demand limit toward a new optimum in relation to the new level of production. More generally, the control system according to the present invention will be adapted to production changes downward as well as upward in order to maintain at all times, during the billing period an optimum target by allowing the demand limit imposed at the beginning of any demand period to float up and down in relation with fluctuations of the actual demand input to the plant facility.

An object of the present invention is to provide a system for monitoring and adjusting power demand within a demand period in which the power consumed during such demand period does not exceed a demand limit automatically selected by reference to actual demand within a prior demand period.

Another object of the present invention is to provide monitoring and adjusting of power demand within a demand period in accordance with an optimal demand limit.

Still another object of the present invention is to provide monitoring and adjusting of power demand of a plant for the billing period in accordance with a demand limit fluctuating up and down over the demand periods in response to actual demand.

It is a further object of the present invention to provide a power demand control system for imposing, during successive control periods, a power demand limit to a plurality of loads of different status and priorities of a production plant in which the imposed limit is automatically adjusted from one demand period to the next in order to follow closely the needs of the production plant.

Another object of the present invention is to provide a power demand control sytem for imposing during the demand periods a power demand limit to a plurality of loads of different status and priorities of a production plant in which the power demand limit at the beginning of each period is allowed to float automatically in accordance with the needs of the plant.

SUMMARY OF THE INVENTION

The present invention is an improvement over the concept of power demand control under an assigned demand limit, or target, imposed at the beginning of a demand period which is to be met within a reasonable margin at the end of the demand period (e.g. 15 minutes).

In accordance with the present invention, the demand period no longer follows such assigned demand limit, or target, but rather, from demand period to demand period, e.g., over the billing period, the target is allowed to follow substantially the actual needs of the production in the plant. More specifically, the target is allowed to float upward as well as downward with the demand.

The invention resides in varying the demand limit of a power demand control system up and/or down during a billing period from one demand period to the next, means being introduced for damping control whenever the assigned target shifts from an upper to a lower limit and conversely, thereby to smooth out the action exerted upon the loads controlled by the control system during the individual demand period.

Thus, the floating demand idea which is basic to the present invention also carries with it the following concepts for controlling the demand:

It is assumed first that from one demand period to the next the target has become too low for the needs of the plant. This occurs when the base loads, the non-controllable loads and the loads under constraints have so much increased the demand that the controllable loads no longer can limit the demand. In other words the latter have all been shed or are to be shed with no avail. In such event, the target is unrealistic. In accordance with the present invention, when this happens, the target is automatically raised to a point where the controllable loads have become again effective, under control, to keep the demand on target during the demand period.

It is assumed now that the target is set too high by an operator for the needs of a plant. The target is, then, automatically lowered for an effective cost reduction during a billing period.

As it appears, application of the basic concept of the present invention may involve the concepts of changing the target up and down from demand period to demand period, of assigning to the system different targets higher or lower at different times. A trial target having been assigned initially, the demand is allowed to float automatically in either direction thereafter.

BRIEF DESCRIPTION OF THE DRAWINGS

The invention will now be described in the context of the supply of electrical energy by a utility power supply company to an industrial plant, and reference shall be made to the accompanying drawings in which.

GENERAL DESCRIPTION OF THE INVENTION OF THE CONTEXT OF THE STRUCTURAL AND OPERATIVE CHARACTERISTICS OF THE POWER DEMAND CONTROL SYSTEM OF UNITED STATES PATENT NO. 3,872,286

For the sake of clarity and for the purpose of illustration only, the present invention will be described in the context of the power demand control system of U.S. Pat. No. 3,872,286.

Figure 1:
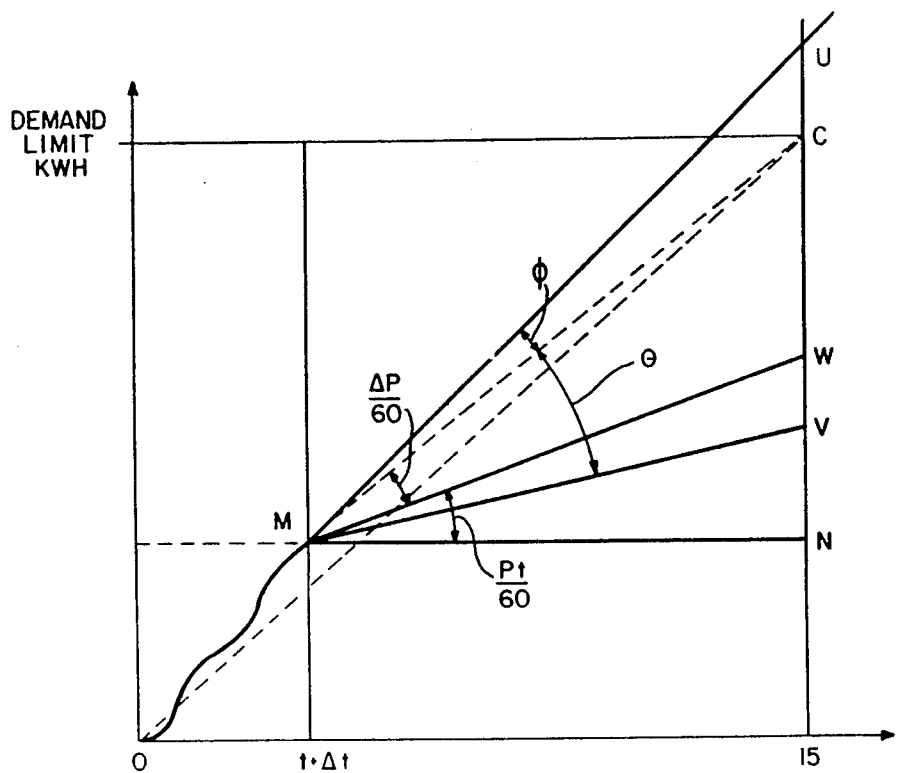
FIG. 1 illustrates diagrammatically the principle of calculation of the demand error used in a control system of the prior art for power demand control.

FIG. 1 illustrates the principle of calculation of the error for any point M along the trajectory during a demand period of 15 minutes. A clock installed by the power supply company determines the initial time of each demand period, (or the final time of a preceding demand period). The watthour meter provides a "KHW pulse" which represents the magnitude of the power which has been consumed during a certain instant $\Delta t$ corresponding to a full rotation of the disc of the meter, thus representing a constant increment or unit of energy (KWH). Thus, the $\Delta t$ interval appearing along the time axis is essentially variable. This time interval is detected as a representation of the slope at point M and it represents the power $P_t$ in KW hour/hour. If the load of the plant is maintained in the same condition until the end of the 15 minute period, the energy curve will follow the tangent MW. However, the Demand Limit should be at C. Therefore there is an error CW by default, which in terms of power is:

$$\Delta P = (60) \times CN/15 - t - P_t$$

as is evident from the geometry of triangles MNC and MWC. Having determined Slope = $\Delta P/60$ by triangulation, and the sign of the error, depending upon whether the intersection point W is above or below the target C, control is effected by selectively adding or shedding suitable loads in the plant. In order to more closely follow the target, a deadband may be provided on either side of the trajectory by defining two angles $\phi$ and $\theta$ which should not be exceeded. The deadband will contain excessive control but will leave free control of the loads as long as the projected tangent remains within two limits MU and MV (FIG. 1) so defined. Such deadband is made variable as will be explained later. The upper limit MU will represent the "decrease vector" and the lower limit MV of the deadband will represent the "increase vector" for control.

It will be hereinafter assumed that the power demand results from a plurality of loads which at least in part can only be switched ON or OFF under constraints existing either at all times or occurring at least at the instant of control. However, by ON and OFF, it is understood that the loads, if electrical, need not be switched by electrical connecting or disconnecting. A power consumption can be increased or decreased by mechanical connection or disconnection of the load as well, such as by means of a clutch or valve actuation.

When several loads are available for being switched ON or OFF, there is an ambiguity as to the response that can be made for proper control. For example, at times a load switched OFF by the controller may already be OFF. The particular load to be switched ON by the controller might have been previously put out of service. It is also possible that control of the demand be prevented by an overriding and external control equipment associated with the load, as is usual with air conditioners, chillers, or air compressors, for instance. Other types of constraints can be found in the particular industrial plant of a customer to a power company, and are within the scope of application of the present invention.

A judicious selection is made of the loads in order to respect these constraints by eliminating from the priorities set among the loads, those which are found to be in violation of the existing or anticipated constraints. Thus the priorities are not only determined by a predetermined classification of the loads, they are also changed in the course of the control process in order to take into account the history of the loads as it appears from a reappraisal of the availability to be switched ON or OFF, during the demand limit control process.

The selection of a load not only depends upon the overall status of the different loads, but also upon the behavior of any particular load in the user's plant. The control method thereof provides for a dynamic allocation of priorities in the selection of the loads to be controlled at any particular time.

The method also provides for relative control, rather than an absolute control of the loads, any selected and controlled load change being effected independently from the base load and from non-controlled loads.

The control method further takes into account the established constraints. For instance, besides interruptible loads which can be selected to be shed or to be added, there may be in the plant loads having a non-controllable status, which otherwise could defeat the control system. However, the control system may also limit its own capability of switching loads in order to accept the non-controllable loads as a favorable factor of correction when in the demand limit control mode, in particular by making use of a deadband.

The computer system in the demand limit control mode moreover calls for the determination of the constraints either off-line or on-line in order to be able to ascertain with improved accuracy the anticipated effect of control and prepare for the right decision in selecting the loads to be controlled at a given instant or for an emergency action by the present control operation. To this effect a special technique of simulation may be provided on the basis of actual load behavior in the user's plant, and such technique of simulation would be used either as an off-line information providing system to be used preparatory to running of the control system according to the invention, or as an online coordinated helper system for constantly revising predictions and updating data during control of the loads in real time.

Further, the control method provides for in the demand limit control mode, for shedding loads or adding loads to limit the total power demand as desired at the end of any given demand period with modifications in order to maximize the needs for particular loads of the user by minimizing the effect under control of the plant's constraints. To this effect control might not be exerted during a first portion of the demand period, on the assumption that sufficient possibilities of meeting the objectives are still left and are available, as a result of an improved control and improved selection, in the latter part of the demand period. Moreover, when control is performed, during a second and major portion of the demand period, the technique involves the use of a deadband, namely the use of vector limits within which no switching (ON or OFF) of load is effected. In order to allow switching of larger loads when they are selected under the assigned priorities, the control system may be operated with a variable deadband. In addition, a temporary target below the objective can be imposed for control until a certain time limit relatively close to the end of the demand period and when such limit has been reached, the bias so established is progressively reduced to zero until the end of the demand period, at which time the demand limit is substantially achieved.

Figure 2:
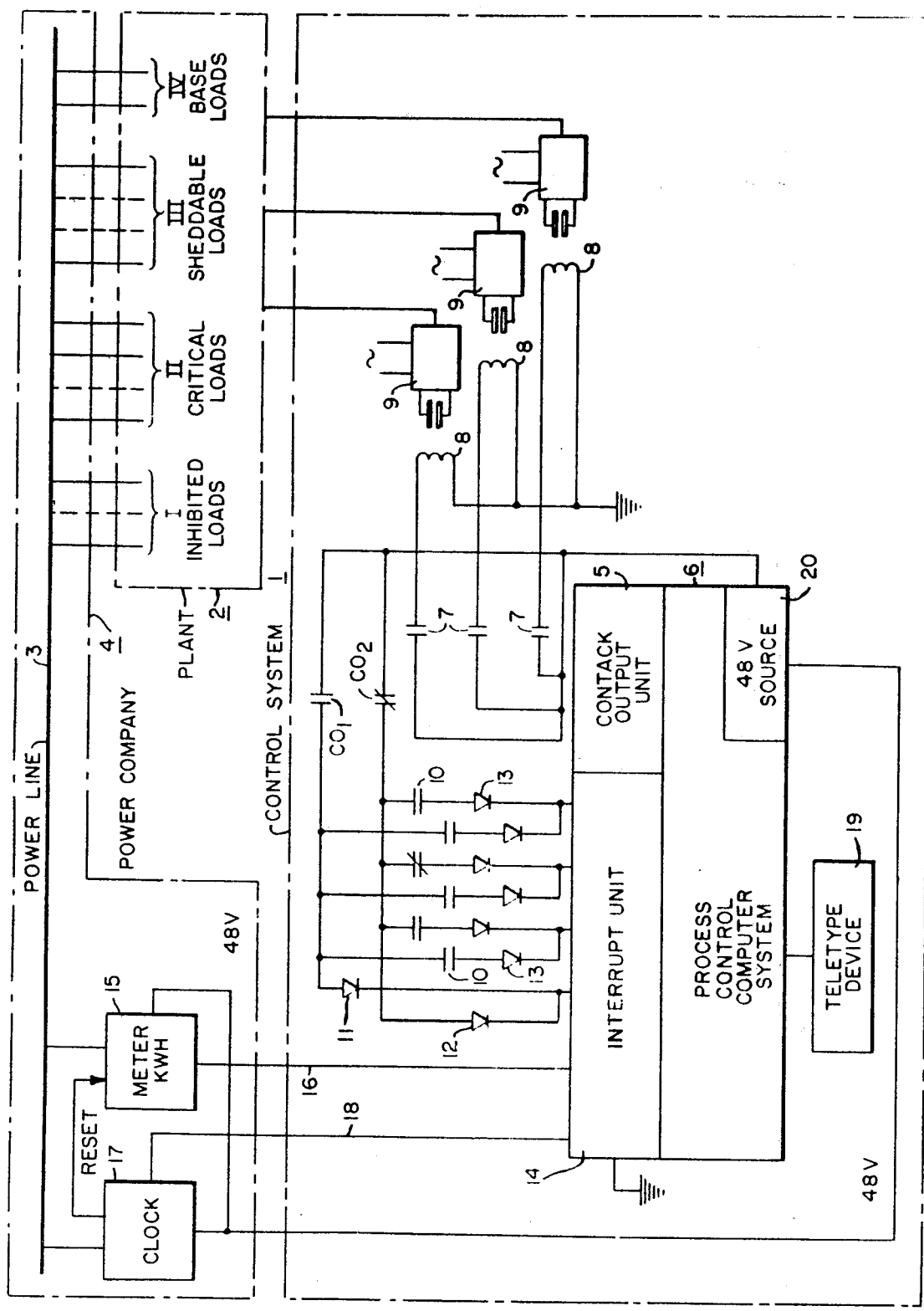
FIG. 2 is an overview of a control system which can be used to implement the method according to the present invention.

Referring to FIG. 2 there is shown an overview of a control system 1 which may be used to implement the according to the present invention. This method is applied to control of the loads of a plant 2 supplied with electrical power on the power supply lines 3 of a power supply.

In the plant there is a base load represented by equipment which is constantly present or at least, if the equipment is switched ON and OFF, such occurrence has in its narrowness a sufficient pattern to equate to a fairly steady load. Therefore, the base load is by definition a non-sheddable load. If control of the base load is not possible, the base load affects by its presence the control of the sheddable loads, since it accounts for a portion of the KWH consumed at any given time. Typical of the base load are the lighting and heating loads, and also certain groups of motors and equipment.

An inhibited load is defined as a load which will be permitted to be switched ON during the first minute of any demand period but will be switched OFF after a certain duration has elapsed and will be inhibited from being switched on again until after the next demand period has begun. For these loads the control system needs to know the duration of ON time from the beginning of a given demand period, and at a given instant whether the load is available for use or not. If the load is available, it will be qualified as permissive.

The sheddable loads are by definition the loads which may become available on a priority basis to be switched ON or OFF, by the control system. This is a general quality of the loads which are not base loads provided they have not a "non-controllable" status. Thus, the constraints of the present industrial plant may limit such "sheddability."

Selection and control of the loads within such constraints are achieved in order to maximize the utilization of the power supplied and minimize the cost of the energy. Heretofore, a sheddable load essentially is a load which can be switched ON or OFF during a certain demand period without affecting the operation of the plant.

An important limitation in the control of an interruptible load is the ON time and the OFF time. It is not advisable to start up a load too often, for instance, for a motor this may have a damaging effect on the windings. Also, electrical surges caused by starting are costly. It might also be economically desirable not to leave an equipment OFF during an excessive time interval. When an excessive OFF time exists, such equipment must be switched ON and and another alternative has to be sought if the shedding of some load is the control action required at that time. The ratio between ON time and OFF time may also introduce a limitation, requiring to keep ON a load.

One important consideration in a power demand control system operation is that while sheddable loads may be available for switching, it is possible to spread the ON times and OFF times within a given demand period and between demand periods in order to spread wear.

A last category of load is the critical load. These are loads which are ON and OFF under external requirements at the plant. For instance, the air conditioners and the compressors follow local conditions. Local control might override action by the control system. Switching ON or OFF of such loads, although required by the demand control system, could be ineffective since the running time for such a load is not known in advance. For this type of load switching ON/OF is constantly monitored.

Referring to FIG. 2, the loads are controlled by a contact output unit 5, which is part of a process control computer system 6. The contact output unit 5 does operate a plurality of load contact outputs 7, each of which closes the energizing circuit of a corresponding relay 8 to actuate the switching element 9 of a load. Such switching element may be the starter of an electrical motor, the plunger of the valve of a compressor, etc.

When a load is in the switched ON condition, a corresponding status contact interrupt 10 is closed as shown on FIG. 11, with the contacts being arranged so as to correspond to the loads. There is shown in FIG. 11 two such groups of contacts with one group being associated with a diode 11 and one scan contact output CO1, and the other group being associated with a diode 12 and another scan contact output CO2. Respective diodes 13 are connected in circuit with corresponding status contact interrupts 10 to establish a circuit from a 48V source 20 provided by the computer system, to ground with the associated diode, 11 or 12. As shown on FIG. 11, concurrent closing of one scan contact output such as CO2 and one particular status contact inerrupt 10, such as shown on the Figure, permits identification by the interrupt unit 14 of the status of the particular contact as being one of Group 2 (CO2 on the Figure).

In order to control the power demand by shedding or adding loads, the control system 1 is responsive to the power consumption continuously recorded by the meter 15 of the power supply company. The process control computer receives over a line 16 the KWH pulse which as a $\Delta t$ characterizes the consumption at any particular instant within the demand period. The power supply company also provides a clock 17 which determines the beginning and the end of each demand period. In the instant case it is assumed that each such demand period lasts 15 minutes. For each turn of the disc of the meter 15 there is a pulse generated which will be hereinafter called "KWH pulse". The succession of these pulses represents on a time scale the power consumed for one turn of the disc. The process control computer system 6 through the interrupt unit 14 assesses the status of the status contact interrupts 10, and more generally monitors all the input fed into the computer system regarding the individual loads in the plant with their constraints, effectuates calculations, makes decisions which are converted, after each of the above-mentioned KWH pulses, into whatever load control action is necessary through the controlled operation of the relays 8.

Included as part of the control system 1, is the process control computer system 6. This computer system can be a digital computer system, such as a Prodac 2000 (P2000) sold by Westinghouse Electric Corporation. A descriptive book entitled "Prodac 2000 Computers Systems Reference Manual" has been published in 1970 by Westinghouse Electric Corporation and made available for the purpose of describing in greater detail this computer system and its operation. The input systems, associated with the computer processor are well known and include a conventional contact closure input system to effectuate scanning of the contacts or other signals representing the status of the equipment. Also, operator controlled and other information input devices and systems are provided such as the teletypewriter 19 shown in FIG. 11. The contact closure output system is also conventional and part of the Prodac 2000 general purpose digital computer system sold.

Although FIG. 2 shows electrical loads which are sheddable or which can be picked up by the demand control system, it should be understood that switching of an electrical load is not the only control action within the scope of the present invention. If it is found not necessary or desirable to limit the demand by switching the actual electrical load ON or OFF in every case, the same result can be obtained by other alternatives. For instance, fan loads can be reduced to some 20% of normal by closing the inlet vanes or damper by means of a servomotor, rather than switching OFF the motor. This operation could be performed relatively frequently and for short periods (for example towards the end of a demand period as a fine trim), whereas there is a limited number of starts per hour allowed for larger motors. When the load involves eddy current couplings or pneumatic clutches, the mechanical loads can be disconnected from their motors. With air compressors having inlet valves, these may be held open by the pressure control equipment when the pressure is high. The control of compressors to maintain demand below the desired level would operate in parallel with the pressure control system with the same goal. These alternatives avoid increasing the cost of maintenance of plant equipment.

The computer system used in the control system according to the invention includes both Hardware and Software. For instance, the interrupt unit 14 is associated with an interrupt handler (50 in FIG. 3). Software is being used as a convenient means of quickly and efficiently performing operations as required in monitoring data, doing calculations, making decisions and translating treatment of information into control action within the short time intervals determined by the recurrent transmission of KWH pulses from the power supply company meter 15.

Figure 3:
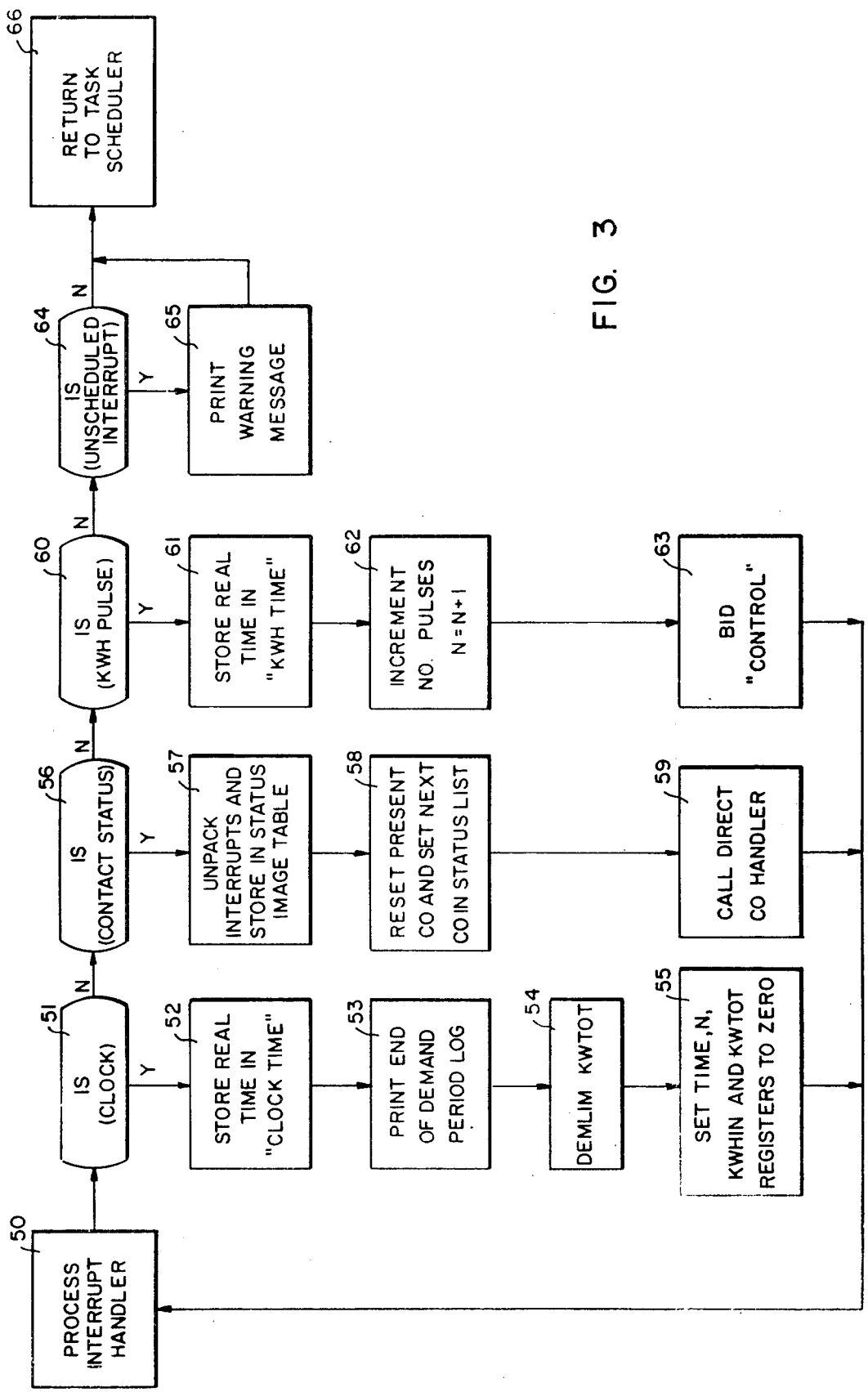
FIG. 3 is a flow chart explaining the operation of the Process Interrupt Handler which is part of a control system for power demand control in the processor.

It is observed that the inputs consist of interrupts which are successively handled by the process interrupt handler (see FIG. 3). One interrupt will receive the 48V DC pulse generated by the external clock and is used to reset the associated registers in the computer when it is received. Another interrupt will receive a train of 48V DC pulses transmitted by the meter 15, each pulse representing KWH (or KVAH) consumed. Another interrupt could be reserved for a second KWH meter if needed. Three other interrupts (the scan contact interrupts 10 of FIG. 11) will receive a status which corresponds to the status of one load contact in the plant and belongs to one group of three associated with one scan contact output (CO1, CO2 on FIG. 2).

The normal operator interface with the system will be via a teletypewriter 19. This device will also provide a log of system performance together with any other messages that may be required. Via the typewriter keyboard the operator will also be able to change the values of various constants relating to the system as a whole or to individual items of equipment. The time and date and on-peak and off-peak demand levels can also be changed using the same keyboard.

Having considered the Hardware aspect of the control system according to the invention, consideration will now be given to the software components of the computer system referring in particular to the flow charts of FIGS. 3, 4A, 4B and 4C. Referring to FIG. 3, the operation of the interrupt handler 50 of the computer system is described. This program will receive T (at step 51) an interrupt from the clock at the beginning of each demand period together with a KWH pulse (at step 60) from the KWH (or KVAH) meter 15 for each revolution of the disc.

In response to a clock pulse, the decision at step 51 is a yes, and the data are transferred to a buffer. These data include time (step 52) the demand limit desired at the end of the demand period (coded as DEMLIN) which is set in the total kilowatt register (KWTOT). At step 53, the program puts data to be printed out for the preceding demand period. The next step (55) is to clear all registers in which accumulated values are stored including time into period and KWH during the period (time, number of pulses N, KWHIN, and KWHTOT registers). Prorated values of time and KWH are stored in those registers when the KWH pulse does not coincide with the clock pulse. The chain returns to the process interrupt handler 50.

If the interrupt relates to a contact status, as seen at step 56, the interrupt is stored at step 51 at the proper location to provide a status image of the array of contact interrupts 10 (FIG. 2). The present contact output is reset and the next contact output is set in the status list (at step 58). At step 59 the contact output handler which corresponds to the contact output unit 5 (FIG. 2) is bid, and the chain returns to the process interrupt handler 50. If the interrupt is the KWH pulse from the meter, as seen at step 60, this data is stored as real time in a "KWH TIME" register. For each turn of the disc of the meter, e.g., for equal increments of energy, one KWH pulse is received. The count is effected at step 62 (N = N + 1), and whenever required, there is a bid for control at step 63. This chain returns also to the process interrupt handler 50. Besides the preceding interrupts which directly determine operation of the control system, there may be other interrupts received, as seen at step 64. Such "unscheduled" interrupts cause at step 65 the printing of a warning message, and there is a return to the task scheduler of the computer system.

Figure 4A:
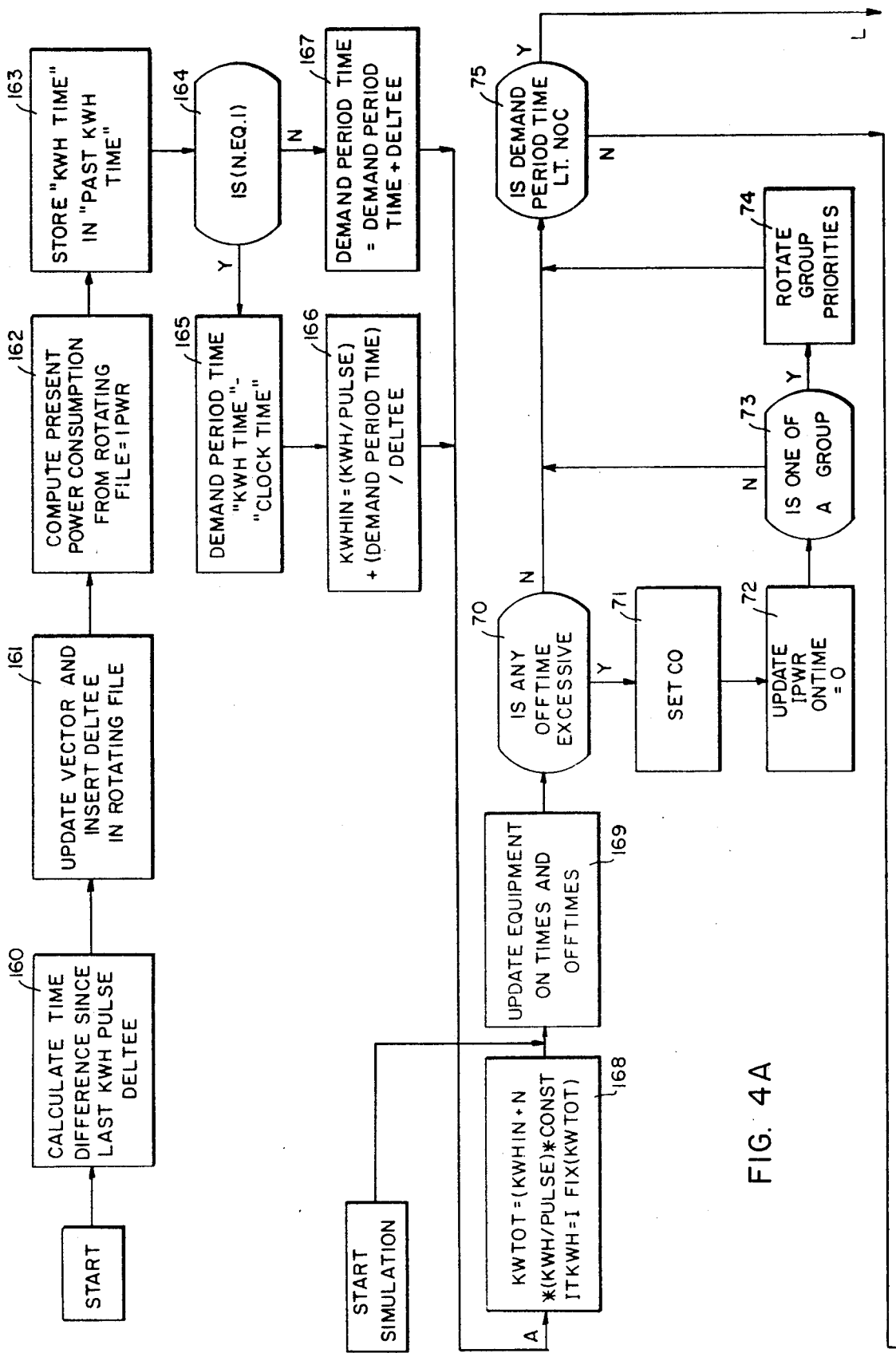
FIGS. 4A, 4B and 4C show an illustrative logic flow chart of a program for power demand control.
Figure 4B:
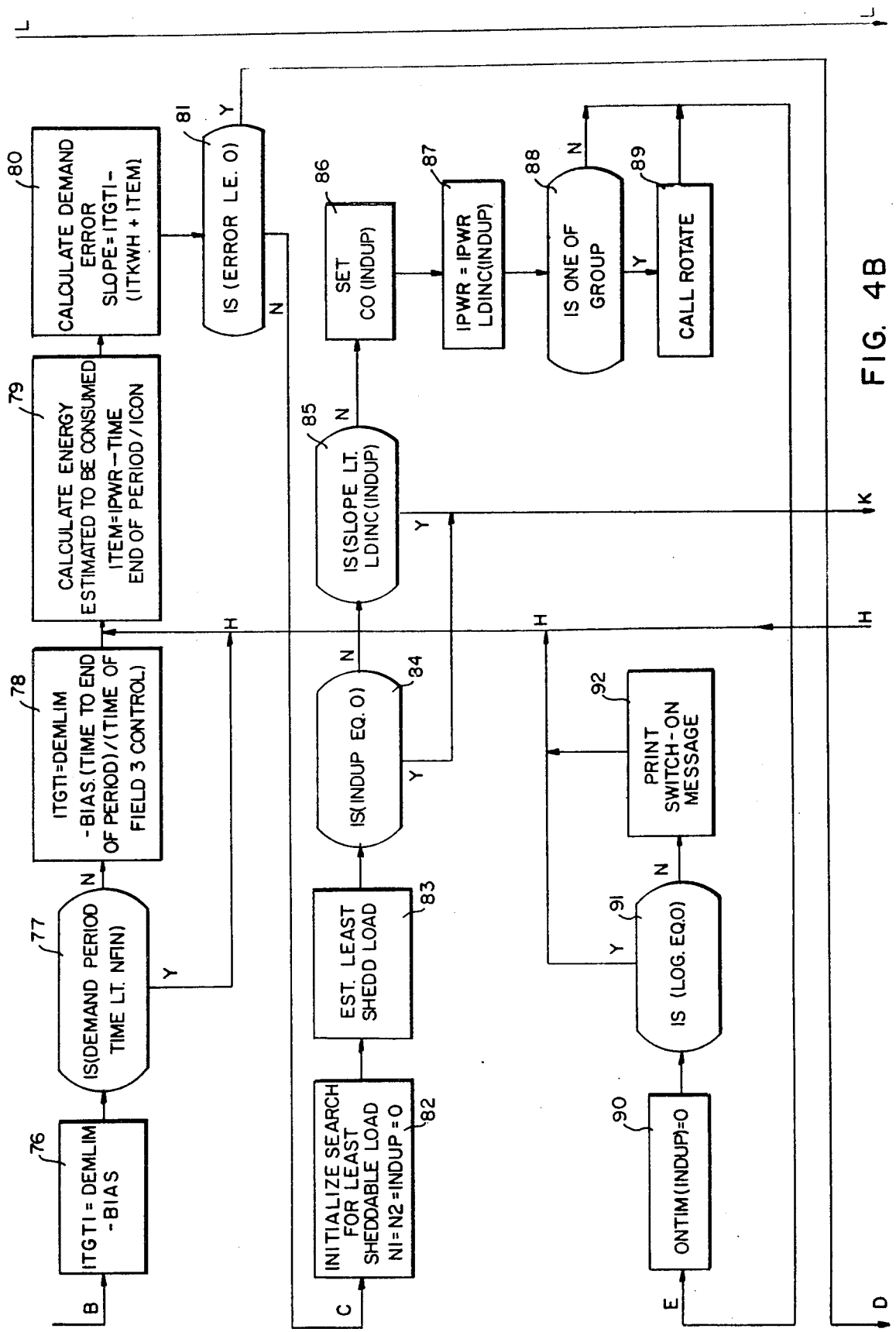
Figure 4C:
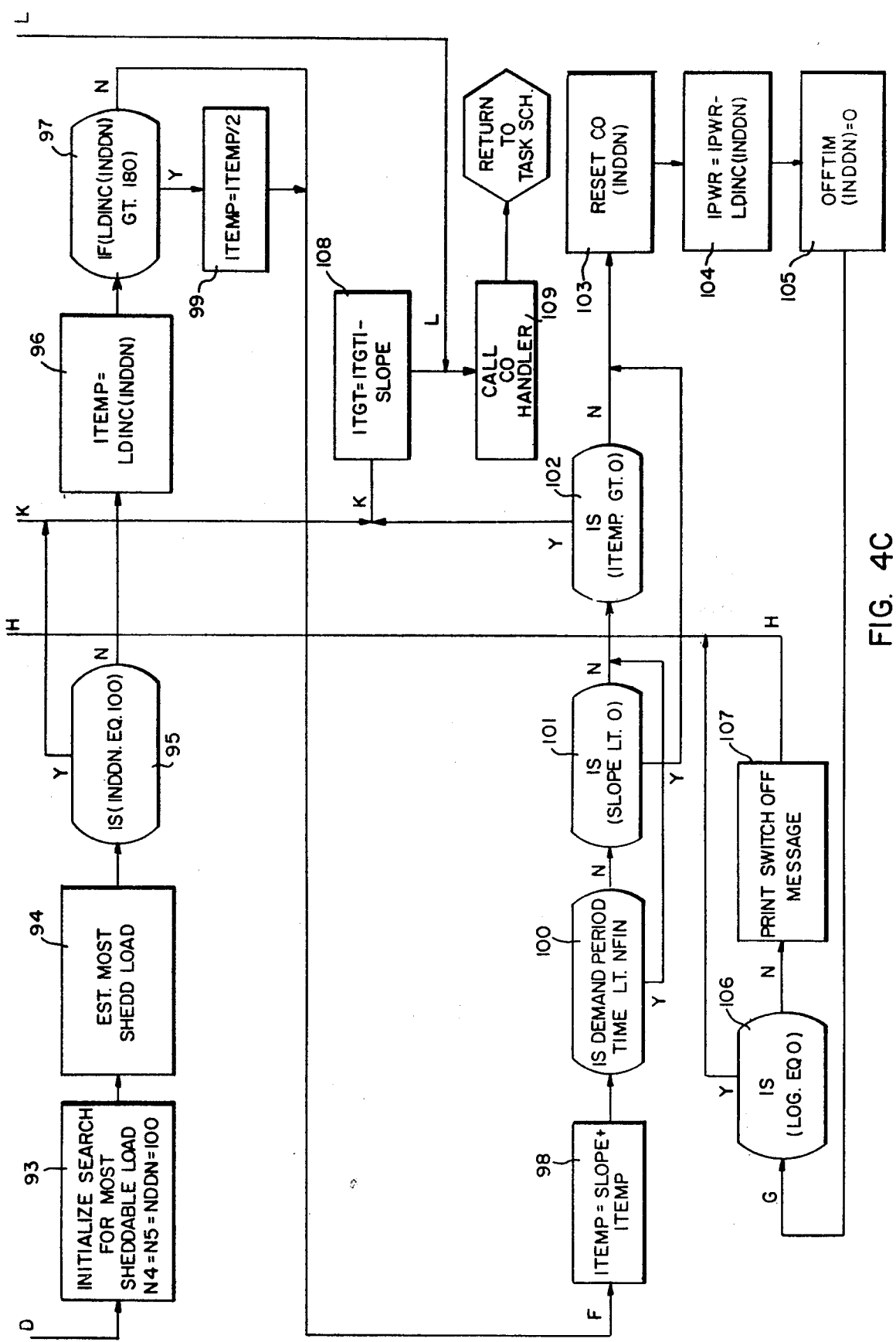

FIGS. 4A, 4B, 4C show a flow chart of the main control program, which is provided to explain the operation of the control system according to the present invention.

When control starts, "DELTEE" e.g., the $\Delta t$ between two successive KWH pulses, is determined by difference. This is step 160. Then a rotating file is updated by adding the last of three successive vectors corresponding to three successive times $t_1$, $t_2$, $t_3$ ($t_3$ being for the latest $\Delta t$ at step 161). At step 162, the present power consumption (IPWR) is computed from the rotating file, and from the present status IPWR is translated at step 163 into the "Past KWH TIME" register. At step 162 the present power consumed is calculated by averaging for three successive points on the trajectory corresponding to times $t_1$, $t_2$ and $t_3$. To this effect an exponential filter is used such as:

$$P_t = [a(a(k/t_1) + (1 - a)(k/t_2)) + (1 - a) k/t_3] \quad (7)$$

where $0.1 < a < 0.4$ and $t_1$ is in hours and $k =$ KWH/pulse.

It is recalled here that while each KWH pulse is received for the same increment of energy (one turn of the disc of the KWH meter), the "DELTEE" represents the power consumed within the period. The first is obtained by integrating the DELTEES corresponding to all KWH pulses received during the period. The energy consumed is equal to the number of pulses multiplied by the meter factor (KWH/pulse). The decision at step 164 (since N is normally greater than 1) is to go to step 167. However, the decision at step 164 is to go to 167 where the demand period time is found to be the sum of the $\Delta t$'s in the period.

The DELTEE corresponding to the first pulse after the clock pulse (N=1) belongs in part to the last demand period and only in part tot he new demand period. In such case, the decision at 164 is to go through steps 165 and 166 which provide a prorated value of the KWHIN in proportion to the fraction of DELTEE pertaining to the new demand period. Accordingly, step 165 provides the time difference between KWH Time and clock time, and at step 166 the prorated value KWHIN is computed.

Looking to A on FIG. 4A, the next step is to compute KWTOT, e.g., the energy consumed during the present demand period until the particular iteration, converted to equivalent power at the end of the period. KWTOT is equal to N (number of pulses) *KWH/pulse *Constant plus the fraction prorated at step 66, if there is one, e.g., KWHIN. Since computation is done with a floating point for increased accuracy, conversion to integer is effected as indicated by ITKWH = IFIX (KWTOT), see (168).

Then, at step 169 the system looks at the status of the ON times and OFF times of the loads, while adding the $\Delta t$ (DELTEE) and it is determined at step 70 whether any load exceeds the OFF time assigned to it. In such a case, a decision is made at 70 to set the contact output to switch the particular load ON (step 71) thereby not to violate the constraint. Since the load has been switched ON, the ON time of this particular load is set to zero (step 72). Also, the energy estimated to be consumed in the overall industrial load system (IPWR) must be updated in order to take into account the load so picked up. However, if the load exceeding its OFF time belongs to a class, or priority including several other loads in order to reduce wear, all the loads of the same class, or priority, are rotated. Rotation is effected at step 74.

Figure 5:
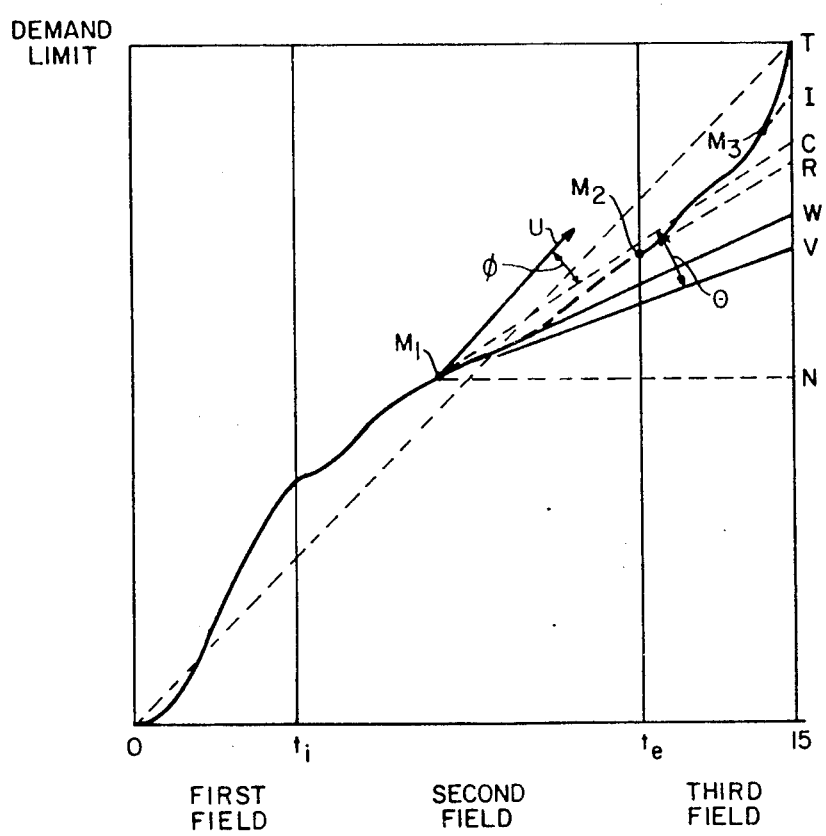
FIG. 5 is a diagram showing a typical strategy of control used for power demand control in the prior art.

The next decision is at 75 depending upon whether the system is under a first field shown from 0 to $t_1$ in FIG. 5, e.g., a first portion of the demand period for which no control is effected (NOC). When the first field terminates, the second field begins which is a field of control, namely at B after step 75. If in response to the decision 75 the control system operates in the no control condition (NOC), the system goes to 109. As a result, the contact output handler will ascertain the status of the contacts. Considering now the chain starting at B for control operation, the second and third fields of controls (from $t_i$ to $t_1$ and from $t_1$ to 15 minutes)

will be explained by reference to FIG. 5. C represents the BIAS in the second field of control, T the original target corresponding to the desired Demand Limit (DEMLIN). The target (ITGTI) in the second field is represented by C, e.g., DEMLIN-BIAS. The control system (FIG. 4B) is set accordingly at step 76. A decision is made at step 77 to choose between the second and third field of control depending upon whether the time in demand period has reached $t_e$ (NFIN) or not. If we are still in the second field, the flow chart goes from 77 directly to step 79. If the third field is required, at step 78, the BIAS is reduced at each iteration until the end of the period. Accordingly, a fraction is used to reduce the BIAS by a ratio between the time left in the period and the duration of the third field. This amounts to a displacement of the target for each point on the trajectory. At steps 79 and 80 the demand error is calculated. ITGTI represents the ordinate of the target (C in the second field, I in the third field, T at the end of the demand period). The ordinate of N (see FIG. 5) is ITKWH obtained at step 168. The ordinate of W is ITKWH + ITEM (e.g., WN). Therefore, the error due to W being too low, or too high, relative to the target is Slope = IGTI − (ITKWH + ITEM). First, at step 79 ITEM is calculated, using data obtained at step 162 (IPWR = present power consumption), and computing the second term in equation (3), e.g., $P_t (T_{max} - t)$. Knowing ITKWH and ITEM, the demand error is calculated at step 80. Then the sign of the Y or N at 81 will tell whether the projected point W lies above or below the target. If it is above, the error is negative and loads have to be switched OFF. The flow chart goes to D. If point W lies below the error is positive and loads must be switched ON. The flow chart goes to C.

First, the situation when the error is positive will be considered by taking the flow chart from C on, in order to find 1) whether there is a load to be switched ON, 2) whether a selected load can be switched ON by step 86.

The computer system then first looks for a load. Step 82 initializes a search for the least sheddable load.

In the table of priorities, the loads are classified from the least sheddable to the most sheddable (which can be understood as from the first to be switched ON to the last to be switched ON). In other words, the search goes from one end of the table when the search is to switch ON a load, and from the opposite end if the search is to switch OFF a load. (The last situation would be at D on the flow chart).

As a general consideration at this point (valid also for OFF switching at D) in a table can be stored or reserved in memory the following characteristics associated with each item of equipment to be of the switchable load type:

Equipment Identity No.
Power Consumed When Starting
Starting Period
Power Consumed When Running
Group Priority
Subgroup Priority
Maximum Allowable Off Time
Minimum On/Off Time Ratio
Minimum Time Between Starts
Availability For Use By The Demand Control System
Address of Associated Contact Output
Amount of Time 'Off' Since Being Switched Off Updated Each Sec., or After
Amount of Time On Since Being Switched On Each KHW Pulse.

The group priority is assigned by the user, the most sheddable loads being low numbers. Priority, or group, numbers increase with the importance of the load to the overall plant operation. The programs associated with this table will be called immediately after the switching decision subroutine, or once per second, to effect: a search through the table to determine the identity of the next load to be switched and the power difference this will make. In the case of large starting currents, a check can be made to see whether starting this motor will cause the maximum demand to be exceeded. If so, the next motor in the sequence will be selected. Similarly, it can be presumed that if the sum of OFF plus ON time is less than the minimum between starts, another unit will be selected for switching ON. In the case of large loads not directly controlled by the computer but for which the computer provides a permissive contact, a check will be made to determine whether the maximum time into the period has not been exceeded and caused to close or open this contact accordingly (see Step 70 on FIG. 4A). If loads have imposed a maximum off time and a minimum on/off time ratio, the computer system would indicate a program to 1) switch that load ON regardless whenever the off time has exceeded the maximum allowable off time; 2) prevent the load from being switched OFF unless the ON/OFF time ratio is greater than the minimum allowed.

Returning to C on the flow chart (FIG. 4B), step 82 provides for indexation of the priority order ($N_1$) and of the subpriority order ($N_2$) for a load to be switched ON (INDUP). At step 83 the search is established accordingly. If the search has not provided at least sheddable load, the decision at step 84 is to go to K, e.g., a no control drain leading to a bid for the CO handler at 109. At step 109, the projection W on the final ordinate of the tangent from the point M on the trajectory (see FIG. 5) is determined as ITGT by the difference between the target and the error. Such information can be conveniently logged for the following reason. ITGT = Ordinate of target (C, if in the second field of control) − error (CW). This is the way ITGT is determined at step 108. But ITGT is also equal to: WN + ordinate of N (see FIG. 5). Since WN = ITEM and ordinate of N = ITKWH, both known by steps 168 and 79, then ITGT is know from previous computations. However, when late in the demand period ITEM becomes very small, therefore a log of ITGT provides a value which tends to be ITKWH equal to the final demand at the end of the demand period.

At step 109 the CO handler of the computer is called upon to check the contact outputs and there is a return to the task scheduler of the computer system.

If, however, a load to be switched ON has been found (NO at 85), (INDUP) the deadband is put into effect at step 85. If the deadband (LDINC) includes vector MW, then no control is effected (YES at 85) and the flow chart goes again to K (again a log of ITGT and a bid for the CO handler). However, if there is a NO at 85 then MW is outside the deadband (LDINC), control is possible and action is bid at step 86. At step 87 the new present power consumed IPWR is calculated by including the added power LDINC and due rotation is effected within a group of loads at step 89 if the load is one of a group.

Having called for the load to be ON, the ON time (ONTIM) for the particular load (or for the rotated group of loads if steps 88, 89 are followed) is initialized at 90 (E), while at step 91 a decision is made to print the "Switch-On" message (92) if the control operation requires it.

Considering now the decision at 85 to switch a selected load ON (if N) or not to switch (if Y), the error CW (FIG. 5 for second field of control) is compared with the increase of power LDINC expected. Control will occur only if LDINC is less than the error. If the selected load can be switched (85), the control action is determined at step 86 and the increased amount of power is accounted for in the new IPWR (step 87). Having called for the load to be ON, the ON time (ONTIM) for the particular load (or for the rotated group of loads if steps 88, 89 are followed) is initialized at 90 (E), while at step 91 a decision is made to print the "switch-ON" message (92) if the control operation requires it.

When the demand error (81) is negative a load must be switched OFF because ITGT is above the target. In such case, the flow chart goes to D (FIG. 4C). Steps 93 and 94 correspond to the steps 82, 83 encountered at C for the positive demand error. The search here is for the most sheddable load, thus from the opposite end of the table of priorities and subpriorities ($N_4$, $N_5$) as opposed to steps 82, 83 for ON switching. When no load to be switched OFF is found, the program indicates 100 as a flag. If this is the case, the flow chart goes to K, and no control is exercised as previously indicated with respect to steps 108, 109. If there is such a load (INDDN), the decision (95, N) is to test the relation of LDINC (the correlative decrease of power if the particular load were effectively switched OFF) to ITEMP which determines the deadband. Two situations happen at this stage depending upon whether the load exceeds 180 KW (Y) or not (N) and the decision is made at 97. If it is a Y, ITEMP is made half of what it is at step 96. In other words, 96 can be read as making the deadband ITEMP = LDINC and 99 as making the deadband ITEMP = ½ LDINC. Assuming 97 leads to N, then ITEMP is made equal to LDINC. This means that at step 98 the slope (CW if in the second field) which is negative is in fact subtracted from LDINC. This difference is a residual error sign of which (in the second field 100 goes to 102) is checked for decision at 102 to control (103) or not (108) switching of the particular load. Again, if the vector or W is within the deadband (between MV and MC), there will be no control. If MW is outside the deadband, then the load will be switched OFF. If control is in the third field (101) then the system merely looks to the error (negative here) to switch (Y) or not the loads OFF.

Once a load is shed (at step 103) the present power IWPR is updated (104). At step 105, the OFFTIM (computed off-time of the load) is updated at each iteration. A decision is made thereafter to log the information (step 106) and to print a switch-OFF message (step 107). After each control operation (shedding or pickup), the energy estimated to be consumed is estimated (at step 79) and the demand error is again calculated in order to establish whether a new load should be switched ON (at C) or OFF (at D).

Once counting of time and power consumption has started for a given demand period, a first field is established during which the load system is left to its own constraints without control (75, I08, NOC). Since there is no control, the slope varies only with the loads. There is no need for a calculation of the slope at any point of the trajectory. Although there is no control during the first field, the status of certain of the interruptible loads may have changed during that time. For instance, in the particular example of the embodiment described, the OFF time of certain loads may have become excessive, and according to step 70, the contact output of such load would have been set (71). Therefore, the control system calls for the CO handler which is the software counterpart of the contact unit 5 (FIG. 2). Thus, a bid is made (109) for the CO handler in order to implement the status of the contact outputs established by the previous iteration.

The system then returns to the task handler. The first field ends at time $t_i$ (FIG. 6) and a second field is established thereafter (N,75).

It should be observed here that there is a difference between (1) the switching ON of a load which has been OFF for an excessive OFF time, such as operated by the system at 70 and 71 (FIG. 13A), and (2) the switching ON of a selected load such as at 86 on FIG. 13B. When there has been an excessive OFF time, the system indeed provides for the switching ON of the load. However, such switching is not really a "controlled" switching in the sense that: a) there is no selection made of the load, no prediction made of the KWH and no decision is done to switch under predetermined conditions which suppose alternative situations; and b) the additional load created at 70 and 71 might go against the overall objective to limit the demand. In contrast, when switching ON a load at 86, a selection (82, 83) is made and the decision to switch is based on an anticipation (80) of an error. Therefore, when referring to switching such as at 70, e.g., under the constraints assigned to the load, the load should be considered as in a "non-controllable" status.

A last remark can be made regarding the overall operations of the control system. Since loads in a non-controllable status spontaneously are switched ON when their OFF time has been exceeded when a flag 100 has appeared to indicate that no load is available to be shed, the system will be itself become effective for control since more loads will become available at the next iterations.

DESCRIPTION OF THE STEPS OF THE METHOD ACCORDING TO THE INVENTION BY REFERENCE TO THE OPERATIVE CONDITIONS OF THE CONTROL SYSTEM OF U.S. PAT. NO. 3,872,286

As shown in copending application Ser. No. 791,827 filed Apr. 28, 1977 by R. Q. Fox, D. Sigut and J. H. McWhirter, it has been proposed to substitute for a fixed demand limit during a billing period (one month time) a target moving upward from demand period to demand period (15 minutes) according to the actual demand required by the production facility and as recorded during a previous demand period, whenever the actual demand exceeds the previously assigned target.

The present invention proposes to made target adjustments downward, as well as upward, in order to respond to a reduction of the assigned production capacity of the plant, thereby to follow more closely possible fluctuations of the actual demand of a plant facility during at least one billing period.

Figure 6:
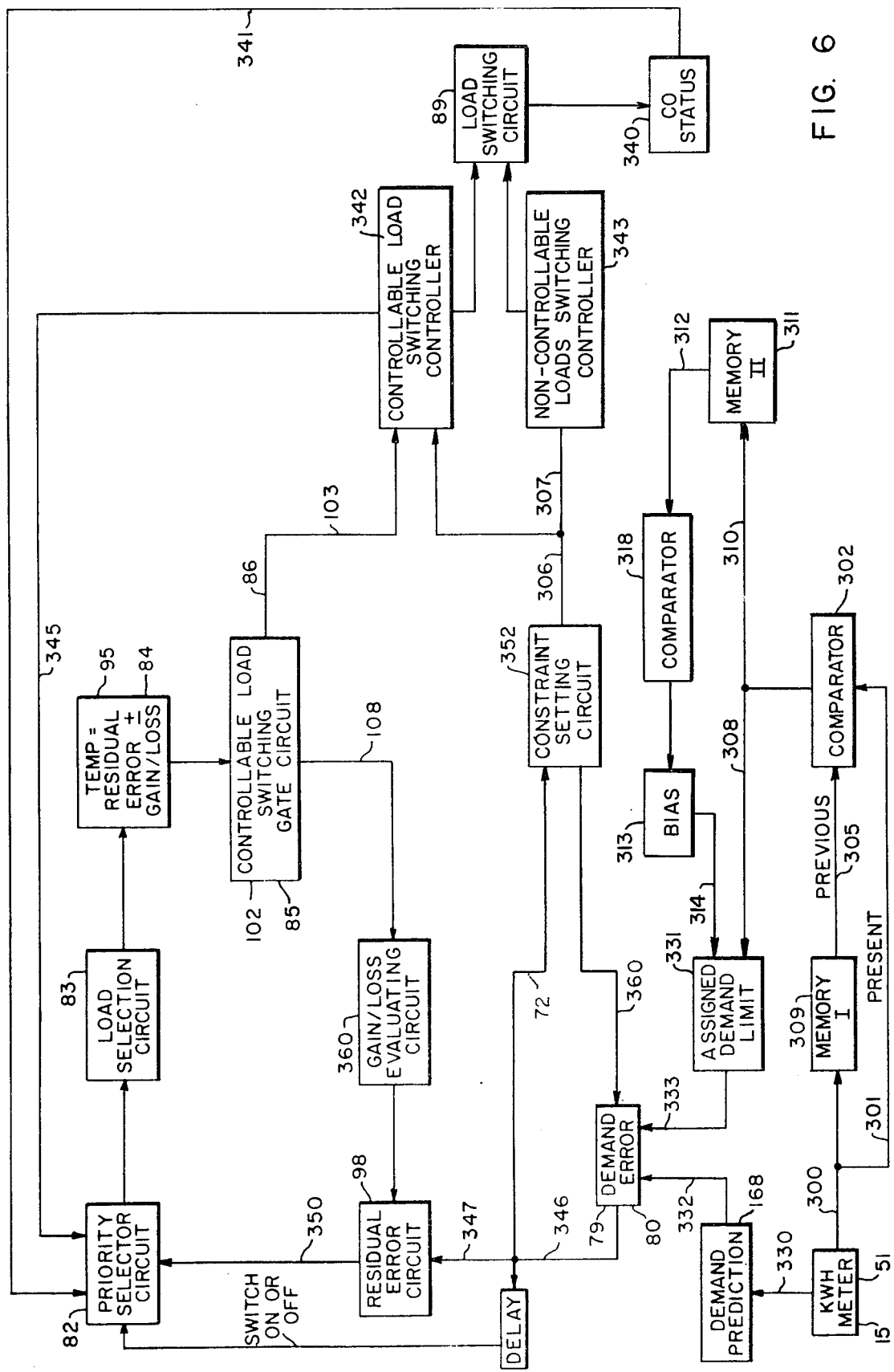
FIG. 6 is a block diagram illustrating the operative steps of the method according to the present invention in the context of a power demand control system described in U.S. Pat. No. 3,872,286 of Putman.

Referring to FIG. 6, a diagrammatic representation of the organization of the control system according to the present invention is provided in the context of the power demand control system of U.S. Pat. No. 3,872,286. The main functions used in the preferred embodiment of the invention are indicated on FIG. 6 and identified by block. All blocks which have already been explained by reference to FIGS. 3 and 4A–4C have been referred to by the same reference numerals wherever found in those early figures.

The KWH meter (15, 51) of the power company provides on line 330 an indication of the power consumed on a one second basis every time the wattmeter has completed one revolution. As explained hereabove by reference to FIGS. 1 and 5, at every second during the 15 minute demand period the wattage indicates the slope of the tangent at the operative point (M, $M_1$) on the demand curve (OM, $OM_1$). This slope is used to extrapolate to the end of the 15 minute demand period. The extrapolation by the demand prediction block 168 estimates the segment NC (FIG. 5) supported by tangent $M_1C$. The error CT established by reference to the assigned demand limit is calculated by demand error block 79, 80 which is responsive to signals on lines 332, 333 from the demand prediction block 168 and the demand limit block 331, respectively.

Turning now to the right side of FIG. 6, the load switching circuit 89 represents an array of individual switches such as (8, 9) in FIG. 2. Switching of the loads is reflected by the status of contacts such as $CO_1$, $CO_2$. A CO status circuit 340 translates such information on line 341 to a priority selector circuit 82. The load switching circuit is controlled by load switching control circuits 342, 343, affected to controllable loads and non-controllable loads, respectively.

The controllable load switching controller 342 is gated by controllable load switching gate circuit (102, 85) from lines 86, 103, whenever switching of the particular load is permitted. Selection of a controllable load results from positive decision in an error circulating loop comprising residual error circuit 98, priority selector circuit 82 (as affected by the status of the contacts CO from line 341) and the effective successive earlier operations of the controllable load switching controller 342 (as reflected from line 345 to priority selector circuit 82 in a controllable load controlling loop). The error is recirculated in a loop from priority selector circuit 82 into a load selection circuit 83. This loop provides a tentative computation of residual error and gain (or loss) in 95, 84, which is the calculation of TEMP. As a result of such calculation the controllable load switching gate circuit (85, 102) will either allow, or not allow, switching. If switching via 86, 103 is not allowed, the error circulating loop closes via line 108 on the residual error circuit 98 through a gain (or loss) evaluating circuit 360, which in turn will cause another scanning of the priority selector circuit 82 for another iteration. The demand error derived on line 346, 347 is applied to the residual error circuit 98. As a result, the determined power gain or loss due to the switching of a prospective controllable load by 342 and 89, once translated via 45 into the priority selector circuit 82, then subtracted from the predicted demand error on lines 346, 347, thus providing a residual error on line 350, thereby to cause a search for an available load by scanning through the priority selector circuit 82.

The demand error takes into account not only the prediction of the demand (168) at the time and the demand limit (331) assigned for the particular demand period but also the constraints which have been exercised in the meantime by the constraint exercising loop which is effective on the production and non-production loads having a constraint. As earlier explained, the constraints when exercised may cause a load to be inhibited from switching, or become available for switching, depending upon the ON/OFF ratio established for a particular load, the permutation order under load rotations, the expiration of the ON-time, or of the OFF-time. After a demand error has been determined on line 46, and before any calculation of the residual error by block 98, the constraints are exercised via line 108, 72 onto the load constraint setting circuit 352. Block 352 establishes the present constraints for the loads of the controllable and non-controllable type, e.g. onto controllers 342, 343, respectively. The load switching circuit 89 will effect switching of the selected controllable loads and assume the constraints of the non-controllable loads, accordingly.

The diagram of FIG. 6 further includes a first memory, (memory I) at 309, for storing the input demand translated from the KWH meter (15, 51) via line 300. A comparator 302 is responsive to the stored value from memory 309 via line 305, and to the present value of the input demand from the KW meter, via line 301. Comparator 302 uses the stored, or previous demand, on line 305 as a reference. Whenever the present value on line 301 exceeds or falls under the reference by a given amount, comparator 302 raises or decreases the assigned demand (331), via line 308, to the present value. As a result, for the next demand period the demand error circuit (79, 80) will determine the error in the demand prediction (168) by reference to the new assigned demand.

The system thus inherently provides for a floating demand upward or downward as soon as the productivity in the plant has shown that the previously assigned demand limit was too low or too high for the needs of the production facility. A less or more rigid control is therefore applied by the system to the loads under their order of priorities (82).

FIG. 6 also includes a second memory, memory II at 311, which is responsive via line 310 to action of comparator 302. A second comparator 318 is responsive to the difference between successive states of memory 311. Whenever the difference expresses a large deviation between two assigned demands on 308, e.g. whenever a positive direction of control (increase or decrease) is followed by a negative direction of control (decrease or increase) a biasing circuit 313 is controlled by the comparator 318 to introduce a bias to the assigned demand 331, thereby to reduce the target in the last control operation, or effective demand period of control. As a result of such bias, a damping effect is introduced between opposite directions of control to avoid submitting the plant to an erratic succession of decision to shed, or not to shed, loads in the power demand controlling process.

It is understood that, the larger the difference between demand limits in opposite direction, the larger may be the bias applied by circuit 313, and conversely. As a practical realization, the assigned demand limit is substituted for the previous one, preferably, whenever the actual demand differs therefrom by a minimum amount.

The following is a program listing of an actual operation of the control system according to the invention:

```
                         -continued
C                          IS THIS A NEW PEAK PERIOD
10      IF (DLKW. LE. DLLIM) GO TO 60
C                          YES, LOG WARNING MESSAGE
        WRITE (IPR, 15)
15      FORMAT(' DEMAND LIMIT EXCEEDED')
C                          IS THERE A FLOATING TARGET OPTION
        IF (I:FLOAT. EQ. 0) GO TO 999
C                          YES, UPDATE TARGET
        DEMLIM=DLKW
C                          LOG NEW TARGET
        WRITE (IPR, 20) DLLIM, DLKW
20      FORMAT ('. DEMAND LIMIT FLOAT'/'OLD=',
            F7.0, 'NEW=', F7.0)
C                          SAVE NEW TARGET IN LEARNING TABLES
        RLEARN(MONTH)=(RLEARN(MONTH)*SAMPLE(MONTH)+DLKW)/
            SAMPLE(MONTH)+1.
        SAMPLE(MONTH) = SAMPLE(MONTH)+1.
C                          IS THIS START OF NEW BILLING PERIOD
60      IF (DAY. NE. 1) GO TO 999
C                          YES, USE NEW TARGET
        DEMLIM = RLEARN(MONTH)
C                          LOG NEW TARGET
        WRITE (IPR, 70) DEMLIM
70      FORMAT (' NEW TARGET FOR MONTH IS ', F7.0)
C                          EXIT
999     CALL EXIT
```

| Name | LISTING TERM DEFINITIONS | |
|---|---|---|
|  | Type | Function |
| DLKW | REAL | Demand of the Previous Period |
| DLLIM | REAL | Demand Limit |
| I:FLOAT | INTEGER | Floating Target Option Flag 0 = Selected |
| DEMLIM | REAL | Demand Limit for Next Period |
| RLEARN | REAL | Table of Learned Targets |
| SAMPLE | REAL | Table of Counts of Entries in RLEARN |
| MONTH | INTEGER | Month of Year |
| DAY | INTEGER | Day of Month |

Figure 7:
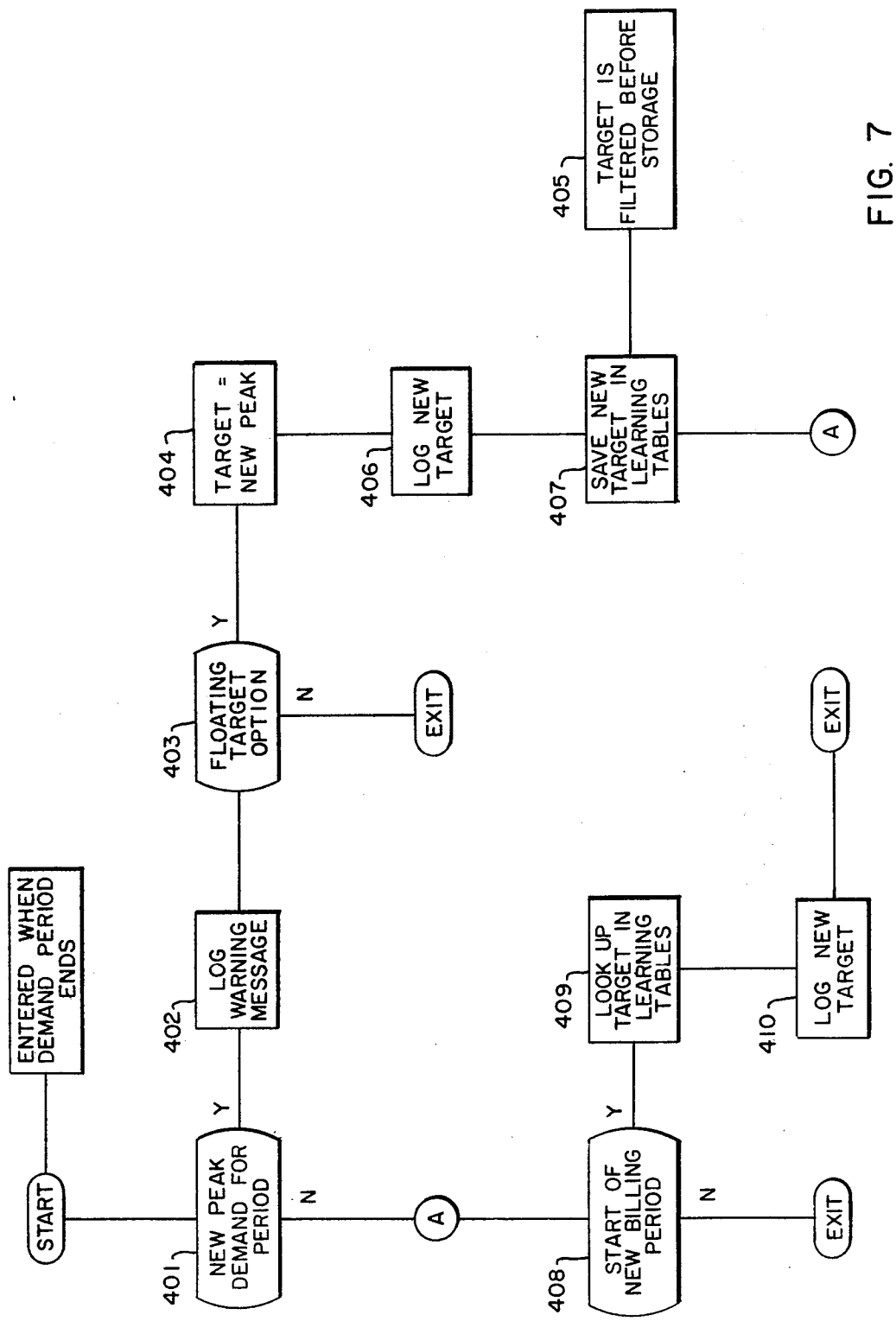
FIG. 7 is a flow chart illustrating operation of the control method according to the invention.

Referring to FIG. 7 and FIG. 6, as well as to the above-stated program listing, a typical flow chart for carrying out the present invention may be read as follows:

At the start, it is determined (at 401) whether the KWH meter has passed a new peak (see comparator 302 and memory I at 309 in FIG. 6).

If there is a new peak, the system goes to 402 (for logging a warning message) and to 403 (floating target option). If the system is ON for floating target (Yes), the demand limit is made equal to the new target (404), e.g. DEMLIM = DLKW.

As a result, the assigned demand unit (331 on FIG. 6) is set by 308 at the level of the new peak. Thereafter, the new target is logged at 406 and stored into learning tables, which are used as the file history of the system (see 407). Before storage, however, (see 405 in FIG. 7) the target is filtered, e.g. using the well known digital filtering techniques, the computer is enabled to establish a "statistically significant mean value" for the demand limit which is being "learned". Thereafter, the system goes into effect with such new target. Indeed, if there has been no peak in the demand during the period (memory I at 309 and comparator 302 in FIG. 6), then the system goes into effect with the current assigned demand limit (331 in FIG. 6). The new billing period is started at 408 (FIG. 7) and the system works generally as explained hereinbelow in relation to FIG. 6.

I claim:

1. A method of limiting the power demand of a plant facility having controllable and non-controllable loads by switching said controllable loads during successive demand periods and selectively in accordance with a pre-established priority list, comprising the steps of:

assigning at the beginning of a given demand period a predetermined demand limit to be met at the end of said given demand period;

recording the actual demand at the end of said given demand period;

assigning for a subsequent demand period a demand limit other than said predetermined demand limit, said other demand limit being equal to said recorded actual demand when said actual demand differs from said predetermined demand limit by a predetermined amount;

predicting a demand at the end of any demand period and deriving a demand error by reference to the assigned demand limit with said predicted demand; and switching said controllable loads during the demand period to minimize said error.

2. The method of claim 1, with the further steps of:

providing a first signal representative of said predetermined demand limit assigned for said given demand period;

storing a second signal representative of the actual demand recorded at the end of said given demand period; and comparing said first and second signals for establishing said other demand limit when said first signal differs from said second signal by at least said minimum amount.

* * * * *